(12) United States Patent
Tan et al.

(10) Patent No.: US 9,112,763 B1
(45) Date of Patent: Aug. 18, 2015

(54) DEVICE, SYSTEM AND METHOD FOR BI-PHASE MODULATION DECODING

(71) Applicant: O2Micro Inc., Santa Clara, CA (US)

(72) Inventors: Xiaogang Tan, Chengdu (CN); Ke Gao, Chengdu (CN); Fan Dou, Chengdu (CN); Xinsheng Peng, Wuhan (CN); James Wang, San Jose, CA (US)

(73) Assignee: O2MICRO INC., Santa Clara, CA (US)

( * ) Notice: Subject to any disclaimer, the term of this patent is extended or adjusted under 35 U.S.C. 154(b) by 0 days.

(21) Appl. No.: 14/322,103

(22) Filed: Jul. 2, 2014

(51) Int. Cl.
*H04L 25/49* (2006.01)
*H04L 27/233* (2006.01)

(52) U.S. Cl.
CPC ........ *H04L 25/4904* (2013.01); *H04L 27/2334* (2013.01)

(58) Field of Classification Search
USPC .................. 375/334, 272; 714/792, 795, 796
See application file for complete search history.

(56) References Cited

U.S. PATENT DOCUMENTS

| | | | |
|---|---|---|---|
| 6,603,412 B2 * | 8/2003 | Gatherer et al. | 341/61 |
| 6,785,347 B1 * | 8/2004 | Liu | 375/334 |
| 6,813,743 B1 * | 11/2004 | Eidson | 714/795 |
| 2002/0095640 A1 * | 7/2002 | Arad et al. | 714/792 |
| 2003/0026028 A1 * | 2/2003 | Ichihara et al. | 360/65 |
| 2003/0026201 A1 * | 2/2003 | Arnesen | 370/210 |
| 2007/0162837 A1 * | 7/2007 | Nieminen | 714/796 |

* cited by examiner

*Primary Examiner* — Eva Puente
(74) *Attorney, Agent, or Firm* — Pillsbury Winthrop Shaw Pittman LLP

(57) ABSTRACT

The present disclosure discloses a device, system and method for bi-phase modulation decoding. The bi-phase modulation decoding device includes a sliding-window module and a determination module. The sliding-window module is configured to receive a baseband signal corresponding to a bi-phase modulated signal, and generate a filtered data packet by filtering the baseband signal using sliding-window digital filtering, wherein the filtered data packet comprises a series of sliding-window output values. The determination module configured to determine a bitstream corresponding to the bi-phase modulated signal based on the filtered data packet. The determination module determines a bit value of a first bit cycle of the bi-phase modulated signal based on a sign of a sliding-window output value of the first bit cycle and a sign of a sliding-window output value of a next bit cycle.

25 Claims, 8 Drawing Sheets

DEVICE, SYSTEM AND METHOD FOR BI-PHASE MODULATION DECODING

TECHNICAL FIELD

The present disclosure relates to decoding technology, and more particularly to a device, system and method for bi-phase modulation decoding of wireless charging.

BACKGROUND

The bi-phase modulation encoding technology is a common encoding technology to transmit data. FIG. 1 illustrates bi-phase modulation encoding technology. As shown in FIG. 1, every bit window (i.e., bit cycle) of the bi-phase modulated signal represents a bit value of a logic bit of the bi-phase modulated signal, where every bit window starts with the transition of the logic state. Logic low is represented by a constant logic state of the bit cycle, while logic high is represented by the transition of the logic state at the center of the bit cycle.

During the wireless charging process, the bi-phase modulated signal is transmitted in a back-scattered manner, from a wireless power receiver to a wireless power transmitter, thus decreasing the amplitude of the bi-phase modulated signal and increasing the waveform distortion of the bi-phase modulated signal. However, the existing bi-phase modulation decoding technology is only applied to general communications with large enough amplitude of the bi-phase modulated signal. So it is not applied to decoding in the wireless charging process, and it has other disadvantages such as occupying too many hardware resources and having high bit error rate.

SUMMARY

The technical problem that the present application seeks to solve is to provide a bi-phase modulation decoding device, system and method, which can efficiently and accurately decode the bi-phase modulated signal and can save hardware resources.

To solve the above-mentioned problems, the present disclosure provides a bi-phase modulation decoding device, including a sliding-window module configured to receive a baseband signal corresponding to a bi-phase modulated signal, and generate a filtered data packet by filtering the baseband signal using sliding-window digital filtering. The filtered data packet may include a series of sliding-window output values. The bi-phase modulation decoding device further includes a determination module configured to determine a bitstream corresponding to the bi-phase modulated signal based on the filtered data packet. The determination module determines a bit value of a first bit cycle of the bi-phase modulated signal based on a sign of a sliding-window output value of the first bit cycle and a sign of a sliding-window output value of a next bit cycle.

The present application further provides a bi-phase modulation decoding system, including a carrier separation device, configured to obtain a baseband signal from a bi-phase modulated signal; and a sliding-window decoding device configured to generate a bitstream corresponding to the bi-phase modulated signal. The sliding-window decoding device includes a sliding-window module configured to generate a filtered data packet by filtering the baseband signal using sliding-window digital filtering, comprising a series of sliding-window output values. The sliding-window decoding device further includes a determination module configured to determine the bitstream corresponding to the bi-phase modulated signal according to the filtered data packet. The determination module determines a bit value of a first bit cycle based on a sign of a sliding-window output value of the first bit cycle and a sign of a sliding-window output value of a next bit cycle.

The present application further provides a bi-phase modulation decoding method including generating, by filtering the baseband signal using sliding-window digital filtering, a filtered data packet comprising a series of sliding-window output values; and determining a bitstream corresponding to the bi-phase modulated signal based on the filtered data packet, Determining the bitstream corresponding to the bi-phase modulated signal includes determining a bit value of a first bit cycle based on a sign of a sliding-window output value of the first bit cycle and a sign of a sliding-window output value of a next bit cycle.

Compared with the prior art, the bi-phase modulation decoding device, system and method according to the present disclosure can properly select sliding-window output values and determine signs of sliding-window output values, thus decoding the bi-phase modulated signal more efficiently and accurately, without being influenced by the waveform distortion of the modulated signal.

BRIEF DESCRIPTION OF THE DRAWINGS

Features and benefits of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present disclosure. While the present disclosure will be described in conjunction with these embodiments, it will be understood that they are not intended to limit the present disclosure to these embodiments. On the contrary, the present disclosure is intended to cover alternatives, modifications and equivalents, which may be included within the spirit and scope of the present disclosure as defined by the appended claims.

Furthermore, in the following detailed description of the present disclosure, numerous specific details are set forth in order to provide a thorough understanding of the present disclosure. However, it will be recognized by one of ordinary skill in the art that the present disclosure may be practiced without these specific details. In other instances, well known methods, procedures, components, and circuits have not been described in detail as not to unnecessarily obscure aspects of the present disclosure.

Figure 1:
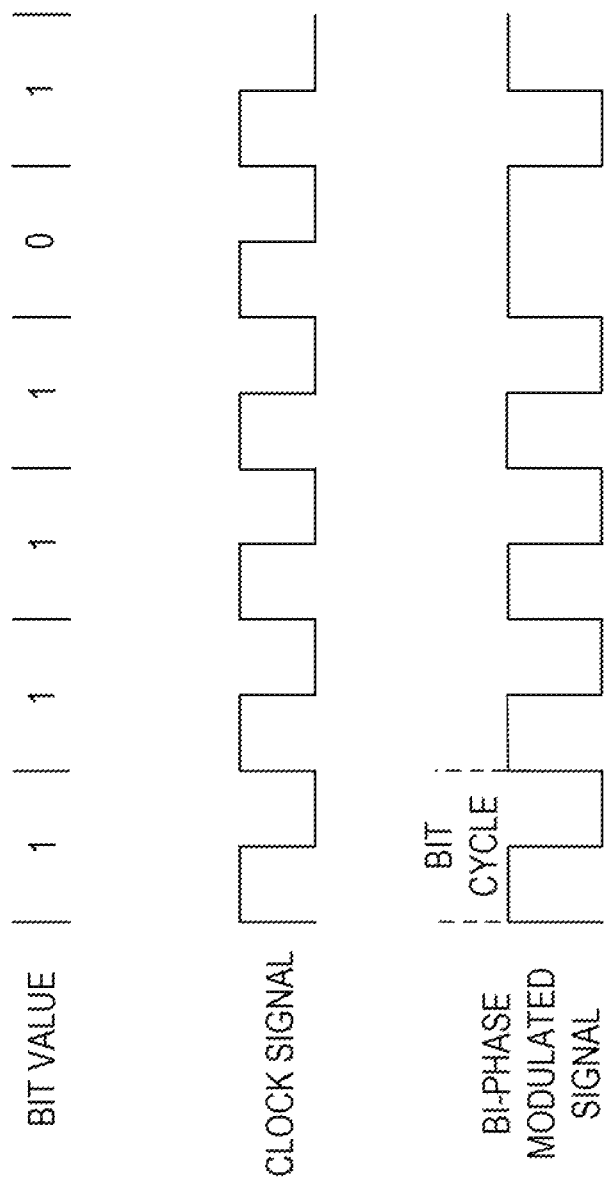
FIG. 1 illustrates bi-phase modulation encoding technology.
Figure 2:
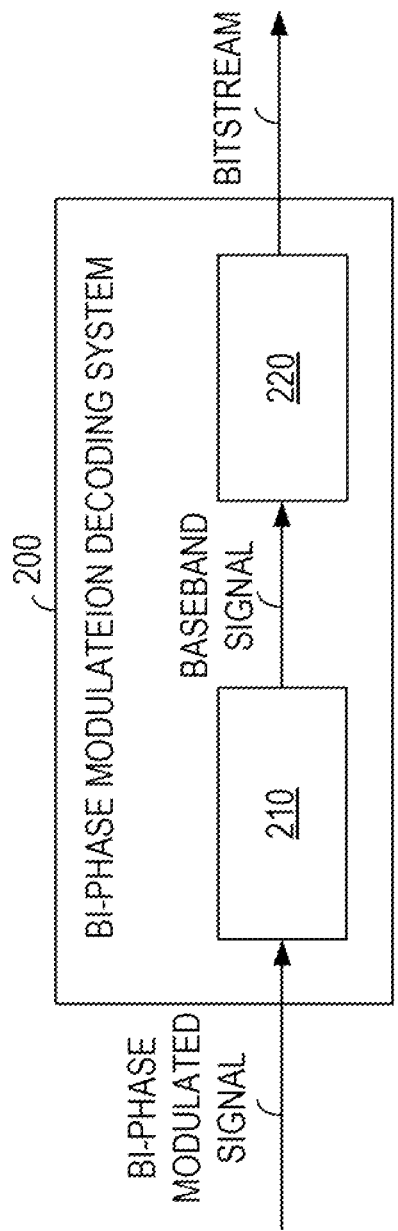
FIG. 2 shows a schematic diagram of a bi-phase modulation decoding system in accordance with one embodiment of the present disclosure.

FIG. 2 shows a schematic diagram of a bi-phase modulation decoding system 200 in accordance with one embodiment of the present disclosure. As shown in FIG. 2, the bi-phase modulation decoding system 200 includes a carrier separation device 210 and a sliding-window decoding device 220. The carrier separation device 210 is configured to receive a bi-phase modulated signal, perform carrier separation operation on the bi-phase modulated, and output the generated baseband signal to the sliding-window decoding device 220.

In one embodiment, the carrier separation device 210 can respectively multiply the bi-phase modulated signal by a sinusoidal signal and a cosine signal to generate two signals. Both signals go through a filter (e.g., a finite impulse response (FIR) filter), an N-point integrator and a squarer to generate two processed signals, which are added together to obtain a baseband signal. However, one skilled in the art should understand that any suitable device and method can be utilized to achieve the carrier separation device 210 and to obtain the baseband signal. The above illustrative description is not the limitation of the present application.

Figure 3:
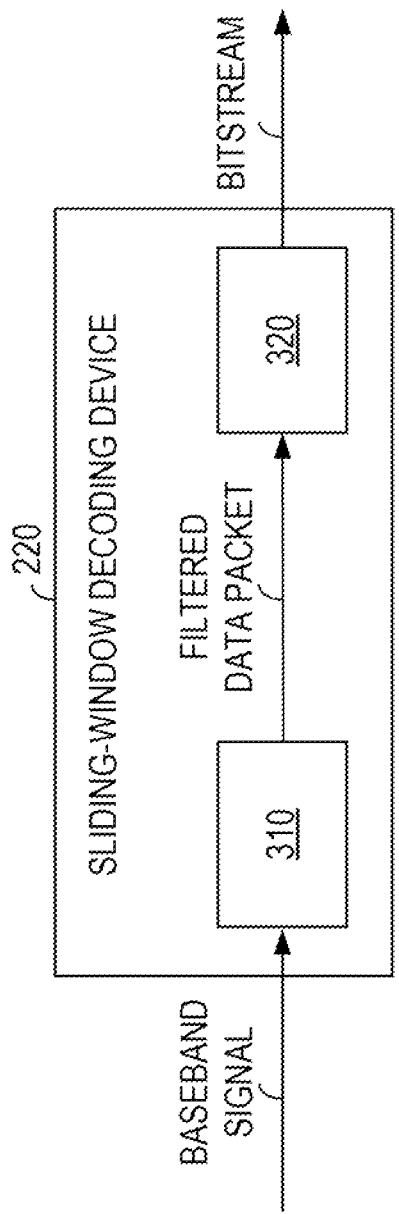
FIG. 3 shows a schematic diagram of a sliding-window decoding device in accordance with one embodiment of the present disclosure.

The sliding-window decoding device 220 coupled to the carrier separation device 210 is configured to receive the baseband signal corresponding to the bi-phase modulated signal from carrier separation device 210, and to perform sliding-window digital filtering on the baseband signal to generate a bitstream. FIG. 3 shows a schematic diagram of the sliding-window decoding device 220 in accordance with one embodiment of the present disclosure. As shown in FIG. 3, the sliding-window decoding device 220 includes a sliding-window module 310 and a determination module 320. The sliding-window module 310 is configured to receive the baseband signal corresponding to the bi-phase modulated signal (e.g., receive the baseband signal from the carrier separation device 210), and to generate a filtered data packet by filtering the baseband signal using sliding-window digital filtering. The filtered data packet includes a series of sliding-window output values. The determination module 320 coupled to sliding-window module 310 is configured to receive the filtered data packet from the sliding-window module 310, and to determine the bit value corresponding to every bit cycle in the bi-phase modulated signal based on the filtered data packet, thus determining the bitstream corresponding to the bi-phase modulated signal.

Figure 4:
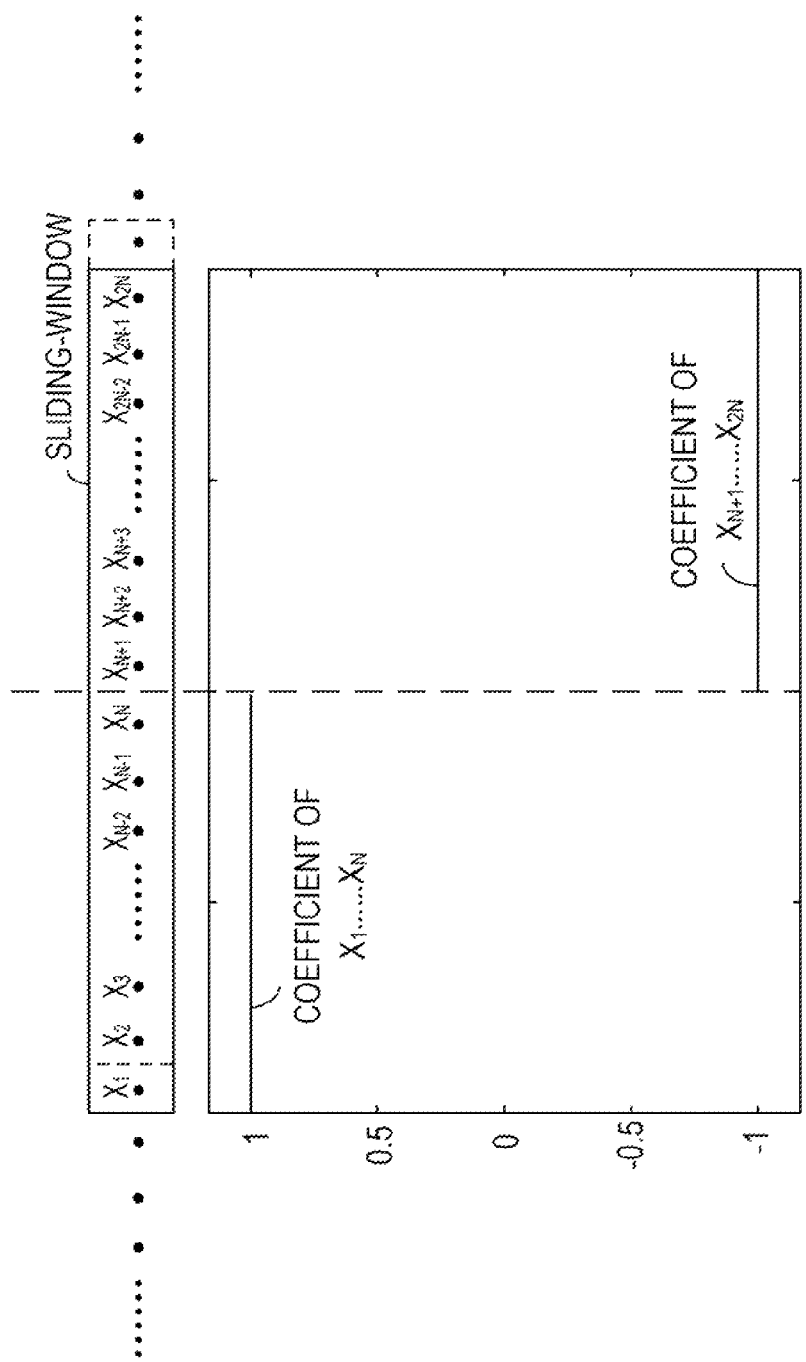
FIG. 4 illustrates the principle of sliding-window filtering in accordance with one embodiment of the present disclosure.

FIG. 4 illustrates the principle of sliding-window filtering, used in the sliding window module 310 of FIG. 3, in accordance with one embodiment of the present disclosure. As shown in FIG. 4, the baseband signal received by the sliding-window module 310 includes a series of digital points. These digital points are listed in their order of reception, each one having its own value. The sliding-window module 310 uses a sliding-window with a fixed length to select 2N consecutive points (e.g., digital points labeled as $X_1, X_2, \ldots, X_{2N}$) at every sliding-window position. The sliding-window slides from left to right, every time sliding a constant distance (e.g., sliding from a position shown with solid line to another position shown with dotted line). The sliding-window module 310 outputs its corresponding sliding-window output value at every sliding-window position, and those sliding-window output values are arranged into a series of sliding-window output values in their order of output. In the example of FIG. 4, the 2N digital points in the sliding-window are equally divided into a left half part including points $X_1, X_2, \ldots, X_N$ and a right half part including points $X_{N+1}, X_{N+2}, X_{2N}$. According to sliding-window filtering characteristics, one skilled in the art should understand that points $X_1, X_2, \ldots, X_N$ can use positive coefficient (1) to perform sliding-window filtering operation, and points $X_{N+1}, X_{N+2}, X_{2N}$ can use negative coefficient (−1) to perform sliding-window filtering operation. Correspondingly, the sliding-window module 310 outputs a sliding-window output value $\Sigma_{i=1}^{N} X_i - \Sigma N_{N+i} X_i$ at every sliding-window position. The above description is not limiting, but only illustrative. In other examples, the sliding-window module 310 can output a sliding-window output value $\Sigma_{i=N}^{2N} X_i - \Sigma_{i=1}^{N} X_i$ at every sliding-window position.

Figure 5:
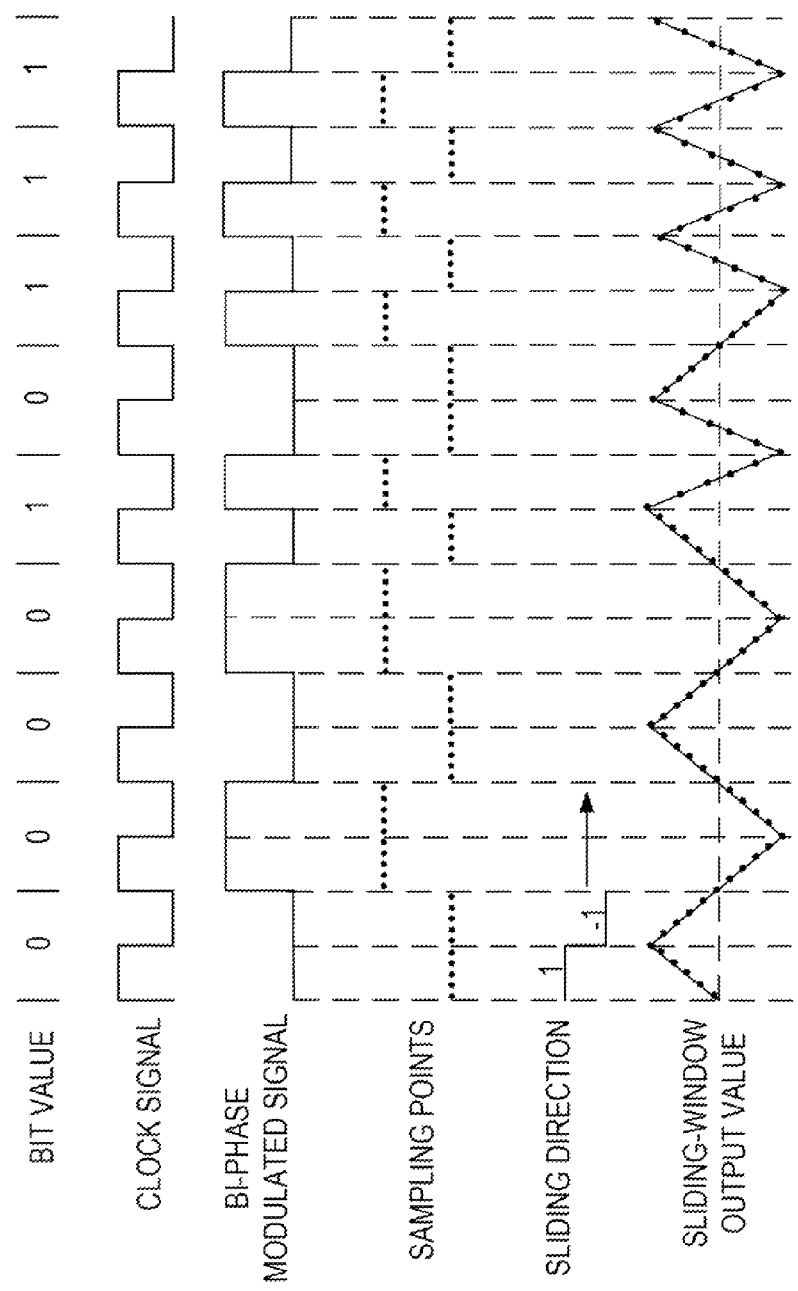
FIG. 5 illustrates sliding-window output values in accordance with one embodiment of the present disclosure.
Figure 7:
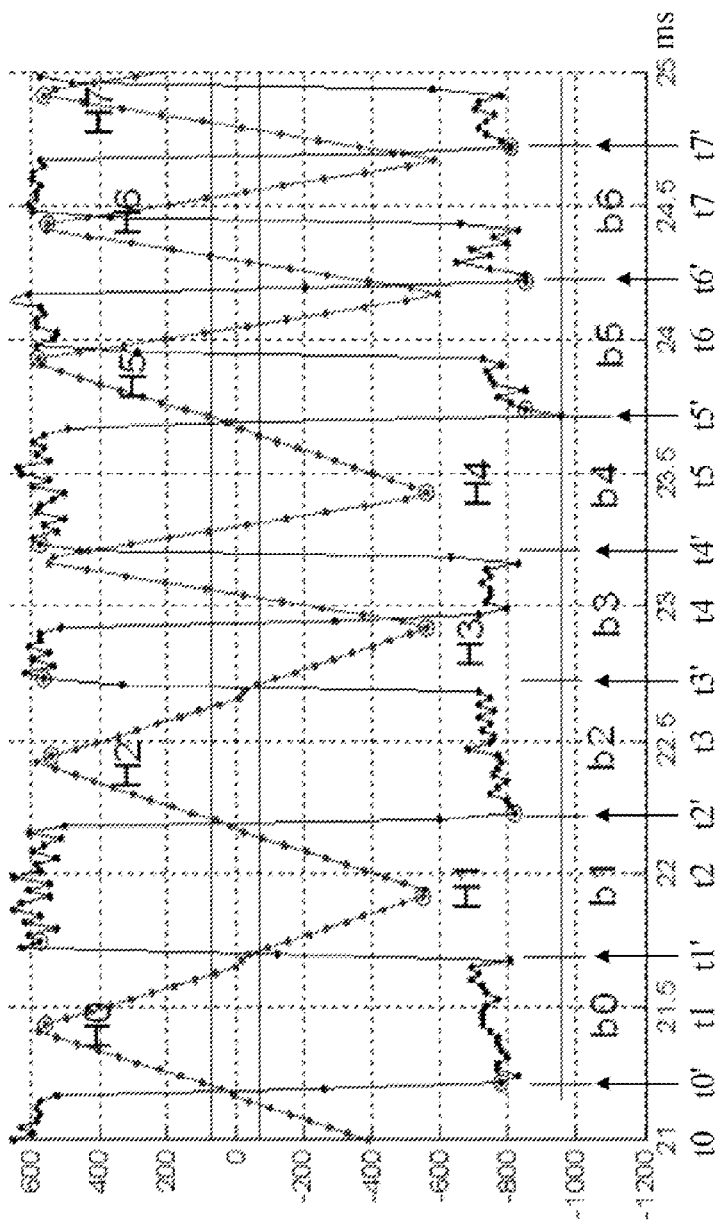
FIG. 7 illustrates a bit value determination process in accordance with one embodiment of the present disclosure.

FIG. 5 illustrates sliding-window output values in accordance with one embodiment of the present disclosure. As shown in FIG. 5, for every bit cycle, the bi-phase modulated signal can be sampled into 2N points (assume N=5, i.e., every bit cycle of the bi-phase modulated signal includes 10 digital points). Ideally, the series of sliding-window output values form a triangular wave. However, in the actual communication process, due to interference of mixed wave and noise, the baseband signal received by the sliding-window module 310 has large waveform distortion compared with sampling points, thus the series of sliding-window output values also have large waveform distortion compared with the triangular wave (as shown in FIG. 7). Therefore, the determination module 320 should determine the bit value corresponding to every bit cycle in the bi-phase modulated signal based on the filtered data packet including the series of sliding-window output values, thus determining the bitstream corresponding to the bi-phase modulated signal.

Figure 6:
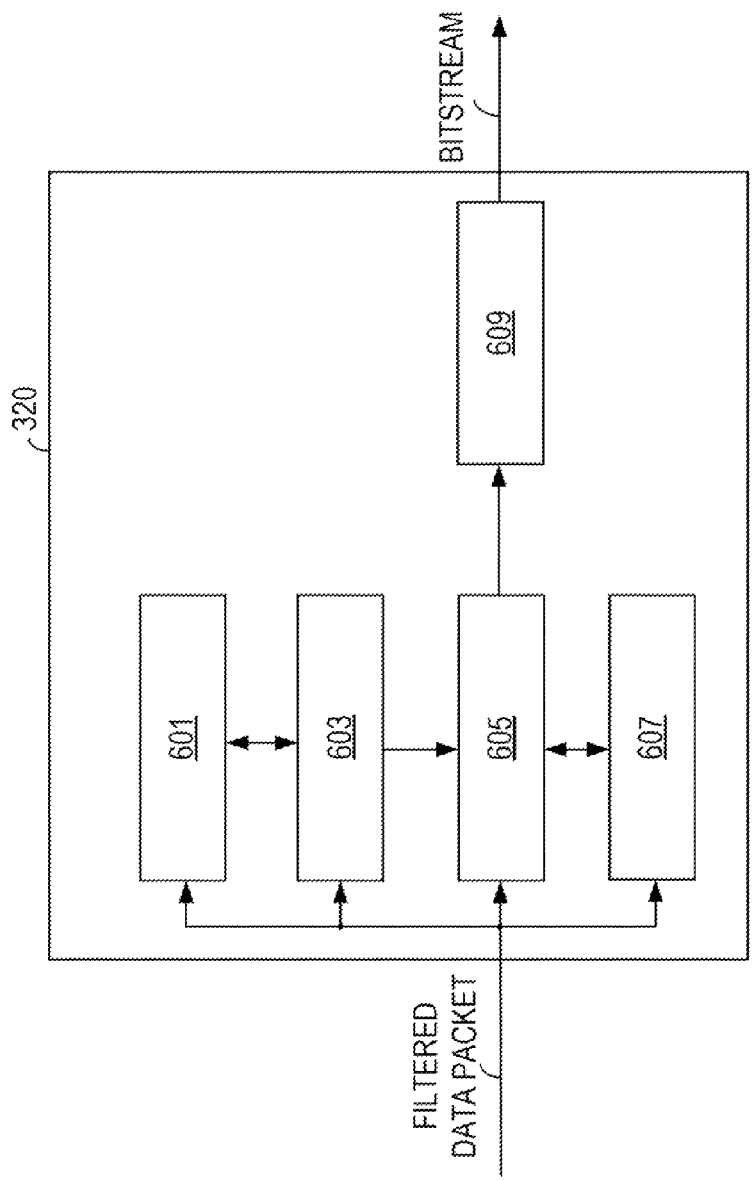
FIG. 6 shows a schematic diagram of a determination module in accordance with one embodiment of the present disclosure.

FIG. 6 shows a schematic diagram of the determination module 320 in accordance with one embodiment of the present disclosure. The determination module 320 includes a threshold calculation unit 601, a data detection unit 603, an output value selection unit 605, a bit boundary adjustment unit 607 and a data packet determination unit 609.

The threshold calculation unit 601 is configured to calculate a threshold value THC based on the filtered data packet from the sliding-window module 310. The data detection unit 603 is configured to provide an indication signal to the threshold calculation unit 601 and the output value selection unit 605 based on the filtered data packet detected based on the threshold value THC. In the example of FIG. 6, the filtered data packet can include a preamble, a header, and a load (related information such as their position, bit number, time points of peak and trough, bit cycle can be obtained by the data detection unit 603).

The threshold calculation unit 601 divides the threshold calculation process into two stages. A first stage is from no signal to the X-th bit (e.g., the 7th bit) of the preamble (start stage). Correspondingly, the threshold value THC is set to a first threshold value TH1, which is used to detect whether there is any signal (i.e., any data packet). In one example embodiment, the threshold calculation unit 601 calculates the first threshold value TH1 by summing every M sliding-window output values of the filtered data packet and subtracting the N largest sliding-window output values of the M sliding-window output values, where M is an integer greater than 2 (e.g., M=69) and N is an integer greater than 0 and less than M (e.g., N=5). One skilled in the art should understand that the above threshold calculation method is only illustrative and is not the limitation of the present application.

If the data detection unit 603 detects that the current sliding-window output value is less than the first threshold value TH1, then the data detection unit 603 generates a first indication signal (e.g., logic 0), which indicates that no new data packet exists. The threshold calculation unit 601 updates the first threshold value TH1 at regular intervals (e.g., 1.725 ms corresponding to 69 sliding-window output values) based on the first indication signal. If the data detection unit 603 detects that the current sliding-window output value is greater than or equal to the first threshold value TH1, then the data detection unit 603 generates a second indication signal (e.g., logic 1), which indicates that a new data packet exists. The threshold calculation unit 601 stops updating the calculation of the first threshold value TH1 based on the second indication signal.

Then, from the Y-th bit (e.g., the 8th bit) of the preamble to the end of the data packet, the threshold calculation process goes into a second stage (end stage). Correspondingly, the threshold value THC is set to a second threshold value TH2, which is used to timely detect a new data packet after a previous data packet ends (even with interference of mixed wave and noise). The second threshold value TH2 can be preset to a suitable value greater than or equal to the stop-updating first threshold value TH1 (e.g., based on experience, the second threshold value TH2 is preset to a value equal to the stop-updating first threshold value TH1).

If the data detection unit 603 detects that the current sliding-window output value is greater than or equal to the second threshold value TH2, then the data detection unit 603 generates a first indication signal (e.g., logic 0), which indicates that the data packet is not over, and the threshold calculation unit 601 does not change its threshold value. If the data detection unit 603 detects that the current sliding-window output value is less than the second threshold value TH2, then the data detection unit 603 generates a second indication signal (e.g., logic 1), which indicates that the data packet is over. The threshold calculation unit 601 stops using the second threshold value TH2 and starts updating the calculation of the first threshold value TH1 based on the second indication signal (go to the first stage again).

As mentioned above, the data detection unit 603 also provides the indication signal (including the first indication signal and the second indication signal) to the output value selection unit 605. After the output value selection unit 605 receives the second indication signal from the data detection unit 603, which indicates that a new data packet exists, the output value selection unit 605 generates a delay signal to the bit boundary adjustment unit 607. The bit boundary adjustment unit 607 adjusts a bit boundary of the bi-phase modulated signal based on the delay signal. For example, the bit boundary adjustment unit 607 shifts the bit boundary of the bi-phase modulated signal by a half bit cycle so as to obtain the adjusted bit boundary. Then, the output value selection unit 605 selects a plurality of sliding-window output values from the series of sliding-window output values according to the adjusted bit boundary. In the example of FIG. 7, at time point 21 ms, the output value selection unit 605 receives the second indication signal from the data detection unit 603, which indicates that a new data packet exists. Here, the time point 21 ms can be regarded as the start time point of the bit cycle t0. Then, the output value selection unit 605 generates the delay signal to the bit boundary adjustment unit 607, and the bit boundary adjustment unit 607 adjusts the bit boundary according to the delay signal. Since the accuracy of the bit boundary greatly influences the waveform distortion, the bit boundary should be properly adjusted (e.g., the bit boundary is shifted by an amount determined based on experience). In one preferred embodiment, the bit boundary adjustment unit 607 shifts the bit boundary by a half bit cycle (e.g., 0.25 ms), then the start time point of the bit cycle is changed from time point t0 to t0'. Correspondingly, following bit boundaries between two adjacent bit cycles will be successively adjusted to t1'-t7'. The adjusted bit boundaries t0'-t7' define the adjusted bit cycles corresponding to bit values b0-b6.

Then, the output value selection unit 605 selects a plurality of sliding-window output values from the series of sliding-window output values according to the adjusted bit boundaries (e.g., t0'-t7'). Specifically, the output value selection unit 605 selects a modulo maximum extreme point (also known as H value) from the series of sliding-window output values for every adjusted bit cycle. As shown in FIG. 7, the output value selection unit 605 successively selects extreme points H0-H6 corresponding to bit values b0-b6, and the output value selection unit 605 further selects a extreme point H7 for a bit value b7 (not shown). The output value selection unit 605 provides the selected plurality of sliding-window output values (e.g., extreme points H0-H6) to the data packet determination unit 609. The data packet determination unit 609 coupled to the output value selection unit 605 is configured to receive the selected plurality of sliding-window output values from the output value selection unit 605, and to determine the bitstream corresponding to the bi-phase modulated signal based on the selected plurality of sliding-window output values. In one embodiment, the data packet determination unit 609 determines a bit value of a first bit cycle of the bi-phase modulated signal based on a sign of a sliding-window output value of the first bit cycle and a sign of a sliding-window output value of a next bit cycle. One way of determining the bit value of the first bit cycle is to perform XNOR (i.e., inverse of exclusive OR) operation on the sign of the sliding-window output value of the first bit cycle and the sign of the sliding-window output value of the next bit cycle. If the selected sliding-window output value (e.g., the extreme point) is a positive number, the sign of the sliding-window output value is 0; and if the selected sliding-window output value (e.g., the extreme point) is a negative number, the sign of the sliding-window output value is 1. One skilled in the art should understand that other suitable methods can be utilized to determine the bit value corresponding to the bit cycle.

In the example of FIG. 7, for the first bit cycle (which is defined by bit boundaries t0' and t1') and the next bit cycle (which is defined by bit boundaries t1' and t2'), the output value selection unit 605 selects the sliding-window output value H0 for the first bit cycle and selects the sliding-window output value H1 for the next bit cycle. The sliding-window output value H0 is a positive number, so the sign of the sliding-window output value $S_{H0}$ is 0. The sliding-window output value H1 is a negative number, so the sign of the sliding-window output value $S_{H1}$ is 1. Therefore, the data packet determination unit 609 determines the bit value $b0=S_{H0} \odot S_{H1}=0 \odot 1=0$. Similarly, the data packet determination unit 609 determines the bit values b1-b6:

$b1=S_{H1} \odot S_{H2}=1 \odot 0=0$;
$b2=S_{H2} \odot S_{H3}=0 \odot 1=0$;
$b3=S_{H3} \odot S_{H4}=1 \odot 1=1$;
$b4=S_{H4} \odot S_{H5}=1 \odot 0=0$;
$b5=S_{H5} \odot S_{H6}=0 \odot 0=1$;
$b6=S_{H6} \odot S_{H7}=0 \odot 0=1$.

Advantageously, the bi-phase modulation decoding device, system and method according to the present disclosure can properly select sliding-window output values and determine signs of sliding-window output values, thus decoding the bi-phase modulated signal more efficiently and accurately, without being influenced by the waveform distortion of the modulated signal.

Figure 8:
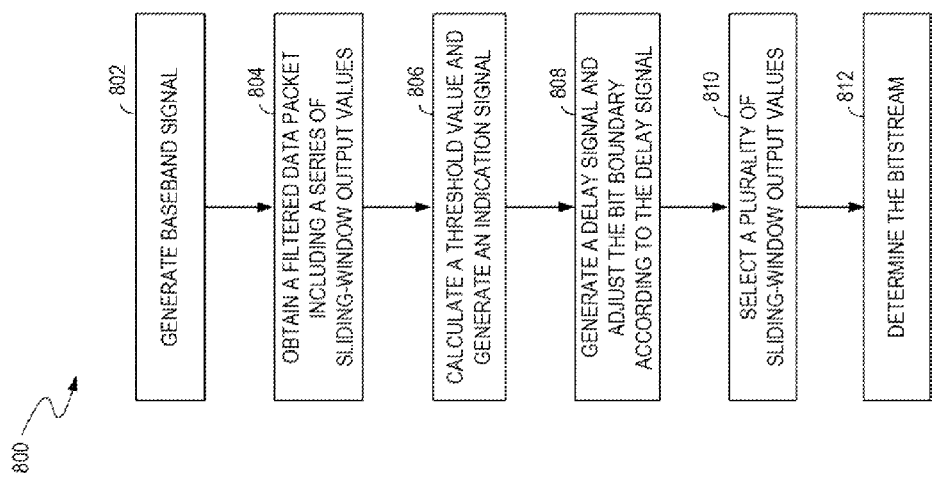
FIG. 8 illustrates a flowchart of a bi-phase modulation decoding method in accordance with one embodiment of the present disclosure.

FIG. 8 illustrates a flowchart of a bi-phase modulation decoding method 800 in accordance with one embodiment of the present disclosure. FIG. 8 is described in combination with FIG. 2 to FIG. 7. However, the bi-phase modulation decoding method 800 of FIG. 8 is not limited to those embodiments.

In step 802, the carrier separation device 210 receives a bi-phase modulated signal, performs carrier separation operation on the bi-phase modulated, and outputs the generated baseband signal to the sliding-window decoding device 220.

In one embodiment, step 802 includes: the carrier separation device 210 respectively multiplies the bi-phase modulated signal by a sinusoidal signal and a cosine signal to generate two signals. Both signals go through e.g., a FIR filter, an N-point integrator and a squarer to generate two processed signals, which are added together to obtain a baseband signal. However, one skilled in the art should understand that any suitable device and method can be utilized to achieve step 802. The above illustrative description is not the limitation of the present application.

In step 804, the sliding-window module 310 receives the baseband signal from the carrier separation device 210, and generates a filtered data packet by filtering the baseband signal using sliding-window digital filtering. The filtered data packet includes a series of sliding-window output values.

For example, in the embodiment of FIG. 4, the baseband signal received by the sliding-window module 310 includes a series of digital points. These digital points are listed in their order of reception, each one having its own value. The sliding-window module 310 uses a sliding-window with a fixed length to select 2N consecutive points (e.g., digital points labeled as $X_1, X_2, \ldots, X_{2N}$) at every sliding-window position. The sliding-window slides from left to right, every time sliding a constant distance (e.g., sliding from a position shown with solid line to another position shown with dotted line). The sliding-window module 310 outputs its corresponding sliding-window output value at every sliding-window position, and those sliding-window output values are arranged into a series of sliding-window output values in their order of output. For example, the sliding-window module 310 can output a corresponding sliding-window output value $\Sigma_{i=1}^{N} X_i - \Sigma_{i=N+1}^{2N} X_i$ or $\Sigma_{i=N+1}^{2N} X_i - \Sigma_{i=1}^{N} X_i$ at every sliding-window position. Ideally, the series of sliding-window output values form a triangular wave. However, in the actual communication process, due to mixed wave and disturb signal, the baseband signal received by the sliding-window module 310 has large waveform distortion compared with sampling points, thus the series of sliding-window output values also having large waveform distortion compared with the triangular wave (as shown in FIG. 7).

In step 806, the threshold calculation unit 601 calculates a threshold value THC based on the filtered data packet from the sliding-window module 310. The data detection unit 603 provides an indication signal to the threshold calculation unit 601 and the output value selection unit 605 based on the filtered data packet detected based on the threshold value THC.

Step 806 can include: in the first stage (e.g., start stage, from no signal to the 7th bit of the preamble), the threshold calculation unit 601 calculates the first threshold value TH1 by summing every M sliding-window output values of the filtered data packet and subtracting the N largest sliding-window output values of the M sliding-window output values, where M is an integer greater than 2 (e.g., M=69) and N is an integer greater than 0 and less than M (e.g., N=5). If the data detection unit 603 detects that the current sliding-window output value is less than the first threshold value TH1, then the data detection unit 603 generates a first indication signal (e.g., logic 0), which indicates that no new data packet exists. The threshold calculation unit 601 updates the first threshold value TH1 at regular intervals (e.g., 1.725 ms corresponding to 69 sliding-window output values) based on the first indication signal. If the data detection unit 603 detects that the current sliding-window output value is greater than or equal to the first threshold value TH1, then the data detection unit 603 generates a second indication signal (e.g., logic 1), which indicates that a new data packet exists. The threshold calculation unit 601 stops updating the calculation of the first threshold value TH1 based on the second indication signal.

Step 806 can further include: in the second stage (e.g., end stage, from the 8th bit of the preamble to the end of the data packet), the threshold calculation unit 601 sets the threshold value THC to a second threshold value TH2 (e.g., the second threshold value TH2 is equal to the stop-updating first threshold value TH1). The second threshold value TH2 is used to timely detect a new data packet after a previous data packet ends (even with mixed wave and disturb signal). If the data detection unit 603 detects that the current sliding-window output value is greater than or equal to the second threshold value TH2, then the data detection unit 603 generates a first indication signal (e.g., logic 0), which indicates that the data packet is not over, and the threshold calculation unit 601 does not change its threshold value. If the data detection unit 603 detects that the current sliding-window output value is less than the second threshold value TH2, then the data detection unit 603 generates a second indication signal (e.g., logic 1), which indicates that the data packet is over. The threshold calculation unit 601 stops using the second threshold value TH2 and starts updating the calculation of the first threshold value TH1 based on the second indication signal (go to the first stage again).

In step 808, the output value selection unit 605 generates a delay signal to the bit boundary adjustment unit 607 according to the indication signal from the data detection unit 603, and the bit boundary adjustment unit 607 adjusts the bit boundary of the bi-phase modulated signal based on the delay signal.

For example, in the preferred embodiment of FIG. 7, in response to the delay signal, the bit boundary adjustment unit 607 can shift the bit boundary by a half bit cycle (e.g., 0.25 ms), then the start time point of the bit cycle is changed from time point t0 to t0'. Correspondingly, following bit boundaries between two adjacent bit cycles will be successively adjusted to t1'-t7'. The adjusted bit boundaries t0'-t7' define the adjusted bit cycles corresponding to bit values b0-b6.

In step 810, the output value selection unit 605 selects a plurality of sliding-window output values from the series of sliding-window output values according to the adjusted bit boundaries.

Specifically, the output value selection unit 605 selects a modulo maximum extreme point (also known as H value) from the series of sliding-window output values for every adjusted bit cycle. As shown in FIG. 7, the output value selection unit 605 successively selects extreme points H0-H6 corresponding to bit values b0-b6, and the output value selection unit 605 further selects a extreme point H7 for a bit value b7 (not shown).

In step 812, the data packet determination unit 609 receives the selected plurality of sliding-window output values from the output value selection unit 605, and determines the bitstream corresponding to the bi-phase modulated signal based on the selected plurality of sliding-window output values.

In one embodiment, step 812 includes: the data packet determination unit 609 determines a bit value of a first bit cycle based on a sign of a sliding-window output value of the first bit cycle and a sign of a sliding-window output value of a next bit cycle. One preferred way of determining the bit value of the first bit cycle is to perform XNOR operation on the sign of the sliding-window output value of the first bit cycle and the sign of the sliding-window output value of the next bit cycle. If the selected sliding-window output value (e.g., the extreme point) is a positive number, the sign of the sliding-window output value is 0; and if the selected sliding-window output value (e.g., the extreme point) is a negative number, the sign of the sliding-window output value is 1. One skilled in the art should understand that other suitable methods can be utilized to determine the bit value corresponding to the bit cycle.

Advantageously, the bi-phase modulation decoding device, system and method according to the present disclosure can properly select sliding-window output values and determine signs of sliding-window output values, thus decoding the bi-phase modulated signal more efficiently and accurately, without being influenced by the waveform distortion of the modulated signal.

While the foregoing description and drawings represent embodiments of the present disclosure, it will be understood that various additions, modifications and substitutions may be made therein without departing from the spirit and scope of the principles of the present disclosure as defined in the accompanying claims. One skilled in the art will appreciate that the present disclosure may be used with many modifications of form, structure, arrangement, proportions, materials, elements, and components and otherwise, used in the practice of the present disclosure, which are particularly adapted to specific environments and operative requirements without departing from the principles of the present disclosure. The presently disclosed embodiments are therefore to be considered in all respects as illustrative and not restrictive, the scope of the present disclosure being indicated by the appended claims and their legal equivalents, and not limited to the foregoing description.

What is claimed is:

1. A bi-phase modulation decoding device, comprising:
a sliding-window module configured to:
receive a baseband signal corresponding to a bi-phase modulated signal, and
generate a filtered data packet by filtering the baseband signal using sliding-window digital filtering, wherein the filtered data packet comprises a series of sliding-window output values; and
a determination module configured to determine a bitstream corresponding to the bi-phase modulated signal based on the filtered data packet,
wherein the determination module determines a bit value of a first bit cycle of the bi-phase modulated signal based on a sign of a sliding-window output value of the first bit cycle and a sign of a sliding-window output value of a next bit cycle.

2. The bi-phase modulation decoding device according to claim 1, wherein the determination module comprises:
a threshold calculation unit configured to calculate a threshold value based on the filtered data packet;
a data detection unit configured to provide an indication signal to the threshold calculation unit based on the filtered data packet detected based on the threshold value;
an output value selection unit configured to:
generate a delay signal according to the indication signal, and
select a plurality of sliding-window output values from the series of sliding-window output values;
a bit boundary adjustment unit configured to adjust a bit boundary of the bi-phase modulated signal based on the delay signal; and
a data determination unit configured to determine the bitstream corresponding to the bi-phase modulated signal based on the selected plurality of sliding-window output values.

3. The bi-phase modulation decoding device according to claim 2, wherein the threshold value is one of a first threshold value and a second threshold value, wherein the threshold calculation unit is further configured to calculate the first threshold value by summing every M sliding-window output values of the filtered data packet and subtracting the N largest sliding-window output values of the M sliding-window output values, and to preset the second threshold value to a value greater than or equal to the first threshold value, wherein M is an integer greater than 2 and N is an integer greater than 0 and less than M.

4. The bi-phase modulation decoding device according to claim 3, wherein in response to the threshold value being the first threshold value:
the data detection unit generates a first indication signal, and the threshold calculation unit updates the first threshold value based on the first indication signal if the current sliding-window output value is less than the first threshold value; and
the data detection unit generates a second indication signal, and the threshold calculation unit stops updating the first threshold value based on the second indication signal if the current sliding-window output value is greater than or equal to the first threshold value.

5. The bi-phase modulation decoding device according to claim 3, wherein in response to the threshold value being the second threshold value:
the data detection unit generates a first indication signal and the threshold calculation unit does not change the threshold value if the current sliding-window output value is greater than or equal to the second threshold value; and
the data detection unit generates a second indication signal, and the threshold calculation unit stops using the second threshold value and starts updating the first threshold value based on the second indication signal if the current sliding-window output value is less than the second threshold value.

6. The bi-phase modulation decoding device according to claim 2, wherein the bit boundary adjustment unit shifts the bit boundary of the bi-phase modulated signal by a half bit cycle to obtain the adjusted bit boundary.

7. The bi-phase modulation decoding device according to claim 2, wherein the output value selection unit selects a modulo maximum sliding-window output value from the series of sliding-window output values for every adjusted bit cycle defined by the adjusted bit boundary.

8. The bi-phase modulation decoding device according to claim 2, wherein the data determination unit performs XNOR (inverse of exclusive OR) operation on the sign of the sliding-window output value of the first bit cycle and the sign of the sliding-window output value of the next bit cycle to determine the bit value of the first bit cycle.

9. A bi-phase modulation decoding system, comprising:
a carrier separation device, configured to obtain a baseband signal from a bi-phase modulated signal; and
a sliding-window decoding device configured to generate a bitstream corresponding to the bi-phase modulated signal, the sliding-window decoding device comprising:

a sliding-window module configured to generate a filtered data packet by filtering the baseband signal using sliding-window digital filtering, comprising a series of sliding-window output values; and a determination module configured to determine the bitstream corresponding to the bi-phase modulated signal according to the filtered data packet, wherein the determination module determines a bit value of a first bit cycle based on a sign of a sliding-window output value of the first bit cycle and a sign of a sliding-window output value of a next bit cycle.

10. The bi-phase modulation decoding system according to claim 9, wherein the determination module comprises:

a threshold calculation unit configured to calculate a threshold value based on the filtered data packet;

a data detection unit configured to provide an indication signal to the threshold calculation unit based on the filtered data packet detected based on the threshold value;

an output value selection unit configured to:
generate a delay signal based on the indication signal, and
select a plurality of sliding-window output values from the series of sliding-window output values;

a bit boundary adjustment unit configured to adjust a bit boundary of the bi-phase modulated signal based on the delay signal; and a data determination unit configured to determine the bitstream corresponding to the bi-phase modulated signal based on the selected plurality of sliding-window output values.

11. The bi-phase modulation decoding system according to claim 10, wherein the threshold value is one of a first threshold value and a second threshold value, wherein the threshold calculation unit is further configured to calculate the first threshold value by summing every M sliding-window output values of the filtered data packet and subtracting the N largest sliding-window output values of the M sliding-window output values, and to preset the second threshold value to a value greater than or equal to the first threshold value, wherein M is an integer greater than 2 and N is an integer greater than 0 and less than M.

12. The bi-phase modulation decoding system according to claim 11, wherein in response to the threshold value being the first threshold value:

the data detection unit generates a first indication signal, and the threshold calculation unit updates the first threshold value based on the first indication signal if the current sliding-window output value is less than the first threshold value; and the data detection unit generates a second indication signal, and the threshold calculation unit stops updating the first threshold value based on the second indication signal if the current sliding-window output value is greater than or equal to the first threshold value.

13. The bi-phase modulation decoding system according to claim 11, wherein in response to the threshold value being the second threshold value:

the data detection unit generates a first indication signal and the threshold calculation unit does not change the threshold value if the current sliding-window output value is greater than or equal to the second threshold value; and the data detection unit generates a second indication signal, and the threshold calculation unit stops using the second threshold value and starts updating the first threshold value based on the second indication signal if the current sliding-window output value is less than the second threshold value.

14. The bi-phase modulation decoding system according to claim 10, wherein the bit boundary adjustment unit shifts the bit boundary of the bi-phase modulated signal by a half bit cycle to obtain the adjusted bit boundary.

15. The bi-phase modulation decoding system according to claim 10, wherein the output value selection unit selects a modulo maximum sliding-window output value from the series of sliding-window output values for every adjusted bit cycle defined by the adjusted bit boundary.

16. The bi-phase modulation decoding system according to claim 10, wherein the data determination unit performs XNOR (inverse of exclusive OR) operation on the sign of the sliding-window output value of the first bit cycle and the sign of the sliding-window output value of the next bit cycle to determine the bit value of the first bit cycle.

17. A bi-phase modulation decoding method, comprising:

generating, by filtering a baseband signal using sliding-window digital filtering, a filtered data packet comprising a series of sliding-window output values; and determining a bitstream corresponding to the bi-phase modulated signal based on the filtered data packet, wherein determining the bitstream corresponding to the bi-phase modulated signal comprises determining a bit value of a first bit cycle based on a sign of a sliding-window output value of the first bit cycle and a sign of a sliding-window output value of a next bit cycle.

18. The bi-phase modulation decoding method according to claim 17, further comprising:

obtaining the baseband signal from the bi-phase modulated signal.

19. The bi-phase modulation decoding method according to claim 17, wherein determining the bitstream corresponding to the bi-phase modulated signal comprises:

calculating a threshold value based on the filtered data packet;

providing an indication signal based on the filtered data packet detected based on the threshold value;

generating a delay signal based on the indication signal;

adjusting a bit boundary of the bi-phase modulated signal based on the delay signal;

selecting a plurality of sliding-window output values from the series of sliding-window output values based on the adjusted bit boundary; and determining the bit value of the first bit cycle according to the sign of the selected sliding-window output value of the first bit cycle and the sign of the selected sliding-window output value of the next bit cycle.

20. The bi-phase modulation decoding method according to claim 19, wherein the threshold value is one of a first threshold value and a second threshold value, and wherein calculating the threshold value comprises:

calculating the first threshold value by summing every M sliding-window output values of the filtered data packet and subtracting the N largest sliding-window output values of the M sliding-window output values, wherein M is an integer greater than 2 and N is an integer greater than 0 and less than M; and presetting the second threshold value to a value greater than or equal to the first threshold value.

21. The bi-phase modulation decoding method according to claim 20, wherein in response to the threshold value being the first threshold value, generating the indication signal comprises:

generating a first indication signal and updating the first threshold value based on the first indication signal if the current sliding-window output value is less than the first threshold value; and generating a second indication signal and stopping updating the first threshold value based on the second indication signal if the current sliding-window output value is greater than or equal to the first threshold value.

22. The bi-phase modulation decoding method according to claim 20, wherein in response to the threshold value being the second threshold value, generating the indication signal comprises:

generating a first indication signal and not changing the threshold value if the current sliding-window output value is greater than or equal to the second threshold value; and generating a second indication signal and stopping using the second threshold value and starting updating the first threshold value based on the second indication signal if the current sliding-window output value is less than the second threshold value.

23. The bi-phase modulation decoding method according to claim 19, wherein adjusting the bit boundary of the bi-phase modulated signal comprises shifting the bit boundary of the bi-phase modulated signal by a half bit cycle to obtain the adjusted bit boundary.

24. The bi-phase modulation decoding method according to claim 19, wherein selecting the plurality of sliding-window output values comprises:

selecting a modulo maximum sliding-window output value from the series of sliding-window output values for every adjusted bit cycle defined by the adjusted bit boundary.

25. The bi-phase modulation decoding method according to claim 19, wherein determining the bit value of the first bit cycle comprises:

performing XNOR (inverse of exclusive OR) operation on the sign of the sliding-window output value of the first bit cycle and the sign of the sliding-window output value of the next bit cycle to determine the bit value of the first bit cycle.

* * * * *